United States Patent
Kirsch

(12)
(10) Patent No.: US 6,335,633 B1
(45) Date of Patent: *Jan. 1, 2002

(54) ADJUSTABLE, FULL CMOS INPUT BUFFER FOR TTL, CMOS, OR LOW SWING INPUT PROTOCOLS

(75) Inventor: Howard Clayton Kirsch, Taoyuan (TW)

(73) Assignee: Vanguard International Semiconductor Corporation, Hsin-chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 09/498,982

(22) Filed: Feb. 7, 2000

Related U.S. Application Data

(63) Continuation of application No. 08/891,973, filed on Jul. 11, 1997, now Pat. No. 6,023,174.

(51) Int. Cl.[7] .......................... H03K 19/003; H03K 17/16
(52) U.S. Cl. .......................... 326/34; 326/31; 326/81; 326/83
(58) Field of Search ................. 326/31–34, 22–24, 326/68, 70–71, 80–81, 83, 17, 87, 121, 26–27

(56) References Cited

U.S. PATENT DOCUMENTS

| | | | |
|---|---|---|---|
| 4,475,050 A | | 10/1984 | Noufer |
| 4,680,491 A | * | 7/1987 | Yokouchi et al. ............. 326/86 |
| 4,763,021 A | * | 8/1988 | Stickel ............................ 326/71 |
| 4,806,801 A | * | 2/1989 | Argade et al. ................. 326/71 |
| 4,988,897 A | * | 1/1991 | Jeong ............................. 326/32 |
| 5,304,867 A | | 4/1994 | Morris |
| 5,334,883 A | * | 8/1994 | Rosenthal ..................... 327/208 |
| 5,341,045 A | * | 8/1994 | Almulla ........................ 326/68 |
| 5,355,033 A | | 10/1994 | Jang |
| 5,532,620 A | * | 7/1996 | Seo et al. ....................... 326/71 |
| 5,602,496 A | * | 2/1997 | Mahmood ...................... 326/68 |
| 5,847,576 A | * | 12/1998 | Mastrocola et al. ........... 326/31 |
| 6,023,174 A | * | 2/2000 | Kirsch ............................ 326/34 |

* cited by examiner

Primary Examiner—Michael Tokar
Assistant Examiner—Steven S. Paik
(74) Attorney, Agent, or Firm—George O. Saile; Stephen B. Ackerman; Billy Knowles

(57) ABSTRACT

An input buffer within an integrated circuit capable of receiving an input signal that complies with the electrical characteristic voltage levels of TTL, LVTTL, SSTL, or GTL, buffering the input signal, and converting the input signal to an output signal having voltage levels acceptable to internal circuitry of the integrated circuits is described. The input buffer will have an adjustable threshold trip point at which the input signal will cause the output signal to change between a first logic state and a second logic state. The adjustable threshold trip point will be determined by an adjustment voltage circuit that is immune to variation in semiconductor processing parameters, power supply voltage and operating temperature.

12 Claims, 7 Drawing Sheets

ADJUSTABLE, FULL CMOS INPUT BUFFER FOR TTL, CMOS, OR LOW SWING INPUT PROTOCOLS

CROSS-REFERENCE TO RELATED APPLICATION

This application is a con of U.S. application Ser. No. 08/891,973 filed Jul. 11, 1997, issued as U.S. Pat. No. 6,023,174 on Feb. 8, 2000.

BACKGROUND OF THE INVENTION

1. Field of the Invention

This invention relates to integrated circuits and more particularly to input buffer circuits at an external interface of integrated circuits that will receive digital signals from external circuitry, buffer the digital signals, and convert the digital signals to voltages level acceptable to internal circuitry within the integrated circuits.

2. Description of Related Art

The design of input buffer circuits for integrated circuits is well known in the art as shown in U.S. Pat. No. 4,475,050 (Noufer), U.S. Pat. No. 5,304,867 (Morris) and U.S. Pat. No. 5,355,033 (Jang). The input buffer is used to accept an input signal that will comply to the electrical characteristics for logic technologies such as transistor-transistor logic (TTL), Low Voltage TTL (LVTTL), Stub Series Terminated Logic (SSTL), and Gunning Transceiver Logic (GTL). The electrical characteristics for these logic technologies are often different from the electrical characteristics of the internal circuitry of the integrated circuits.

The input buffer should be simple in design, have minimal time delay, consume low power, and be highly tolerant to external electrical noise. Additionally the operating characteristics of the input buffer should vary minimally to variations in semiconductor processing parameters, power supply voltage, and temperature.

The standard input buffers of Complementary Metal Oxide Semiconductor (CMOS) integrated circuits are usually either a simple CMOS inverter that may or may not incorporate hysteresis (a Schmitt trigger) as shown in FIG. 1 or a differential amplifier as shown in FIG. 2 The CMOS inverter as shown in FIG. 1 will have a trip point or threshold where the voltage level of the input signal will cause the output to change from the voltage level of a first logic state (0) to the voltage level of a second logic state (1) or from the second logic state (1) to the first logic state (0). The trip point can be modified by the appropriate design of the transistors within the input buffer so that the trip point will correspond as nearly as possible to the midpoint of the possible voltage swing of the input signal.

The CMOS inverter circuit of FIG. 1 is generally the faster approach because the input controls both the NMOS and PMOS transistors by forcing one to a non-conducting state while forcing the other to a conducting state. The effective circuit amplification of this technique is very large. The trip point of the CMOS inverter of FIG. 1 is strongly dependent upon the power supply voltage source and the processing parameters. The variations of the power supply voltage source and the processing parameters will effectively vary the trip point of the CMOS inverter by nearly 0.8V. While this range is satisfactory for logic technologies such as LVTTL, it is not acceptable for such technologies as SSTL.

The differential amplifier input buffer of FIG. 2 will compare the voltage level of the input signals to that of a reference voltage Vref. If the voltage of the input signals transits between a voltage greater than the reference voltage Vref and a voltage less than the reference voltage Vref, the output will transit between the first logic state (0) and the second logic state (1). Since the reference voltage Vref can be precisely designed to be insensitive to variations in semiconductor processing parameters, power supply voltage, and temperature, the trip point can be precisely controlled.

Referring now to FIG. 1 for a more detailed description of a CMOS inverter incorporating a Schmitt trigger. The above described input signal is applied to the input terminal $IN_{ext}$. The input terminal $IN_{ext}$ is generally the input pad of a semiconductor chip and is connected to the external circuitry that will be the source of the input signal. The N-channel metal oxide semiconductor (NMOS) transistors $N_1$, and $N_2$ and the P-channel metal oxide semiconductor (PMOS) transistors $P_2$ and $P_3$ are configured for the CMOS inverter. The gates of the NMOS transistors $N_1$ and $N_2$ and the PMOS transistors $P_2$ and $P_3$ are connected to the input terminal $IN_{ext}$. The PMOS transistor $P_1$ is used to activate and deactivate the CMOS inverter. An enable signal at the ENABLE terminal is connected to the gate of the PMOS transistor $P_1$. If the enable signal is at the first logic state (0) it will cause the PMOS transistor $P_1$ to conduct and the NMOS transistor $N_3$ to cease conduction thus activating the CMOS inverter. However, if the enable signal is at the second logic state (1), it will cause the PMOS transistor $P_1$ to cease conduction and the NMOS transistor $N_3$ to conduct thus deactivating the CMOS inverter and bringing the output to the first logic state (0).

When the CMOS inverter is activated and the input signal begins to transit from a low voltage level or the first logic state (0) to a high voltage level or the second logic state (1), the NMOS transistors $N_1$ and $N_2$ begin to conduct and the PMOS transistors $P_2$ and $P_3$ begin to cease conduction. Once the input signal reaches the trip point, the NMOS transistors $N_1$ and $N_2$ are in equal conduction with the PMOS transistors $P_2$ and $P_3$ and the output is near mid-range. The input signal continues to the second logic state (1). As the loading capacitance attached to the output terminal $OUT_{int}$ is discharged through NMOS transistors $N_1$ and $N_2$, the voltage level at the output terminal $OUT_{int}$ will approach the voltage level of the low supply voltage source. Conversely, when the input signal begins to transit from a high voltage level or the first logic state (1) to the low voltage level or the second logic state (0), NMOS transistors $N_1$ and $N_2$ begin to cease conduction and the PMOS transistors $P_2$ and $P_3$ begin to conduct. As the input signal traverses the trip point, the NMOS transistors $N_1$ and $N_2$ become equal in conduction with the PMOS transistors $P_2$ and $P_3$. The input signal continues to the first logic state (0) The loading capacitance at the output terminal $OUT_{int}$ is now charged to the voltage level of the high supply voltage source through the PMOS transistors $P_2$ and $P_3$.

The trip point can be modified to provide hysteresis or a variation in the level of the trip points for the input signal going from the first logic state (0) to the second logic state (1) versus that of the input signal going from the second logic state (1) to the first logic state (0). The hysteresis is established by either the NMOS transistors $N_4$ or the PMOS transistors $P_4$, which may be optionally added to the circuit to adjust the hysteresis as needed When the input signal at the input terminal $IN_{ext}$ is at the second logic state (1) and the output signal at the output terminal $OUT_{int}$ is at the first logic state (0), the PMOS transistor $P_4$ is in full conduction (the gate to source voltage of PMOS transistor $P_4$ $V_{gs}$ is equal to the negative high supply voltage). As the input signal $IN_{ext}$ traverses from the second logic state (1) to the first logic state (0), The NMOS transistors $N_1$ and $N_2$ begin to conduct so there is current in the drain to source path of the series chain of transistors $P_1$, $P_2$, $P_3$, $N_1$, and $N_2$. Since the PMOS transistor $P_4$ is fully conducting, the common node to the PMOS transistors $P_2$, $P_3$, and $P_4$ is essentially connected to the low supply voltage source. This common node is the source of the PMOS transistor $P_3$ and consequently the PMOS transistor $P_3$ is held in a non-conducting state. As the input signal continues to fall toward the first logic state (0), the PMOS transistor $P_2$ begins to conduct harder and begins to raise the common node to the PMOS transistors $P_2$, $P_3$, and $P_4$ from the low supply voltage level toward the high supply voltage level. The ratio of the sizes of the PMOS transistors $P_2$ and $P_4$ is such that PMOS transistor $P_3$ is conducting when the input signal has reached the midrange of the signal swing (about ½ the high supply voltage level). As soon as the PMOS transistor $P_3$ is in full conduction, the output signal at the output terminal $OUT_{int}$ begins to rise from the first logic state (0) to the second logic state (1). At this time the PMOS transistor $P_4$ begins to cease conduction and the PMOS transistor $P_3$ conducts harder. This will cause positive feedback, thus causing the output signal to rise more rapidly to the second logic state (1). Because to the action of the PMOS transistor $P_4$, the input signal had to transition farther from the second logic state (1) to the first logic state (0) than if the PMOS transistor $P_4$ had not been present, that is the trip point of the buffer was at a lower value for the second logic state (1) to the first logic state (0) transition than for the first logic state (0) to the second logic state (1) transition. The ratio of the geometries of the PMOS transistors $P_2$ and $P_4$ controls the level of the hysteresis.

The NMOS transistor $N_4$ can optionally be added for total symmetry and adjustability of the hysteresis. When the input signal at the input terminal $IN_{ext}$ is at the first logic state (0) and the output signal at the output terminal $OUT_{int}$ is at the second logic state (1), the NMOS transistor $N_4$ is in full conduction (the gate to source voltage of PMOS transistor $N_4$ $V_{gs}$ is equal to the low supply voltage level). As the input signal $IN_{ext}$ traverses from the first logic state (0) to the second logic state (1), The NMOS transistors $N_1$ and $N_2$ begin to conduct so the current in the drain to source path of the series chain of transistors $P_1$, $P_2$, $P_3$, $N_1$, and $N_2$ begins to increase. Since the NMOS transistor $N_4$ is fully conducting, the common node to the NMOS transistors $N_2$, $N_1$, and $N_4$ is essentially connected to the high supply voltage source. This common node is the source of the NMOS transistor $N_1$ and consequently the NMOS transistor $N_1$ is held off. As the input signal continues to rise toward the second logic state (1), the NMOS transistor $N_2$ begins to conduct faster and begins to bring the common node to the NMOS transistors $N_2$, $N_1$, and $N_4$ from the high supply voltage level toward the low supply voltage level. The ratio of the sizes of the NMOS transistors $N_2$ and $N_4$ is such that NMOS transistor $N_1$ is conducting when the input signal has reached the midrange of the signal swing (about ½ the high supply voltage level). As soon as the NMOS transistor $N_1$ is conducting, the output signal at the output terminal $OUT_{int}$ begins to fall from the second logic state (1) to the first logic state (0). At this time the NMOS transistor $N_4$ begins to cease conduction and the NMOS transistor $N_1$ to conduct harder. This will cause positive feedback, thus causing the output signal to fall more rapidly to the first logic state (0). Because to the action of the NMOS transistor $N_4$, the input signal had to transition farther from the first logic state (0) to the second logic state (1) than if the NMOS transistor $N_4$ had not been present, that is the trip point of the buffer was at a lower value for the first logic state (0) to the second logic state (1) transition than for the second logic state (1) to the first logic state (0) transition. The ratio of the geometries of the NMOS transistors $N_2$ and $N_4$ controls the level of the hysteresis.

To understand the operation of a differential input buffer, refer now to FIG. 2. The ratio of the geometry of the PMOS transistor $P_1$ to that of the NMOS transistor $N_3$ is equal to the ratio of the geometry of the PMOS transistor $P_2$ to that of the NMOS transistor $N_4$ ($P_1:N_3::P_2:N_4$) The reference voltage source Vref is coupled through the NMOS transistor $N_1$. to the gate of the NMOS transistor $N_3$, while the input signal is coupled through the NMOS transistor $N_2$ to the gate of the NMOS transistor $N_4$. The reference voltage source Vref forces the NMOS transistor $N_3$ into conduction and establishes a bias point for the gate of the PMOS transistor $P_1$. The ratio of the geometries for the PMOS transistor $P_1$ to the NMOS transistor $N_3$ is chosen such that the bias point is in the midrange between the high supply and the low supply. The common connection of the gates of the PMOS transistors $P_1$ and $P_2$ transfer this bias point to the section of the circuit containing the PMOS transistor $P_2$ and the NMOS transistor $N_4$. When the input signal at the input terminal $IN_{ext}$ is equal to the level of the reference voltage source Vref, the output terminal $OUT_{int}$ is at the bias point. This establishes a tight relationship between the level of the reference voltage source and the trip point of the buffer. If the input signal at the input terminal $IN_{ext}$ is traversing between first logic state (0) and the second logic state (1), the output signal at the output terminal $OUT_{int}$ will switch at the bias point established by the reference voltage source Vref.

The NMOS transistors $N_1$ and $N_2$ are to insure that any noise present at the voltage reference source Vref and the input terminal $IN_{ext}$ become as common mode as is possible. The NMOS transistors $N_1$ and $N_2$ are also decoupled to the high supply voltage source to some degree.

An enable signal at the ENABLE terminal is connected to the gate of the PMOS transistor $P_3$. If the enable signal is at the first logic state (0) it will cause the PMOS transistor $P_1$ thus activating the CMOS inverter. However, if the enable signal is at the second logic state (1), it will cause the PMOS transistor $P_1$ to cease conduction thus deactivating the CMOS inverter.

The PMOS transistor $P_4$ is connected in parallel with the PMOS transistor $P_2$. The gate of the PMOS transistor $P_4$ is connected to the output of the inverter $I_1$ which is the output terminal $OUT_{int}$. The PMOS transistor $P_4$ provides feedback to create hysteresis by effectively changing the ratio of the geometries of the PMOS transistor $P_2$ to that of the NMOS transistor $N_4$ as the circuit is operating.

SUMMARY OF THE INVENTION

An object of this invention is to provide an input buffer within an integrated circuit capable of receiving an input signal that complies with standard electrical characteristic voltage levels such as TTL, LVTTL, SSTL, and GTL or complies with uniquely designed characteristic voltage levels, buffering the input signal, and converting the input signal to an output signal having voltage levels acceptable to internal circuitry of the integrated circuits.

Another object of this invention is to provide an input buffer in which the threshold trip point of the input signal will cause the output signal to change between a first logic state and a second logic state.

Further another object of this invention is to provide an input buffer in which the threshold trip point is determined by an adjustment voltage and is immune to variation in semiconductor processing parameters, power supply voltage and operating temperature.

To accomplish these and other objects, an input buffer circuit has an input terminal coupled to an input/output pad that is connected to external circuitry that will generate the input signal. The buffer output terminal is coupled to the internal circuitry to transfer the output signal to the internal circuitry. A voltage adjustment terminal is coupled to a voltage adjustment circuit that will modify the voltage level characteristic trip point at which the output signal will transit between the first logic state and the second logic state.

The input buffer has a first MOS transistor of a first conductivity type. The first MOS transistor of the first conductivity type has a gate connected to the input terminal, a drain connected to the buffer output terminal, and a source connected to the low supply voltage source, The input buffer has a first MOS transistor of a second conductivity type. The second MOS transistor of the second conductivity type has a gate connected the input terminal, a drain connected to the buffer output terminal, an a source connected to the high supply voltage source. The input buffer has a second MOS transistor of the first conductivity type. The second MOS transistor of the first conductivity type has a gate connected to the input terminal, a drain connected to the buffer output terminal, and a source. The input buffer has a second MOS transistor of the second conductivity type. The second MOS transistor of the second conductivity type has a gate connected to the input terminal and a drain connected to the buffer output terminal. The input buffer has a third MOS transistor of the first conductivity type. The third MOS transistor of the first conductivity type has a gate connected to the voltage adjustment terminal, a drain connected to the source of the second MOS transistor of the first conductivity type, and a source connected to the low power supply. The input buffer has a third MOS transistor of the second conductivity type. The third MOS transistor of the second conductivity type has a gate connected to the voltage adjustment terminal, a drain connected to the source of the second MOS transistor of the second conductivity type, and a source connected to the high power supply.

The voltage adjustment circuit is composed of a duplicate copy of the input buffer circuit scaled to reduce power, an operational amplifier, and an inverter gate that is representative of the internal circuitry of the integrated circuits. The input buffer circuit has its input terminal connected to a voltage reference source. The operational amplifier has a noninverting terminal coupled to the buffer output terminal of the duplicate of the input buffer circuit, and an amplifier output terminal coupled to the voltage adjustment terminal of said duplicate of the input buffer circuit and the voltage adjustment terminal of other input buffer circuits. The inverter gate representative of said internal circuitry has an inverter input terminal coupled to an inverter output terminal and to the inverting terminal of said operational amplifier. The connecting of the inverter input terminal to the inverter output terminal causes voltage level at the inverting terminal of the operational amplifier to be set at an inverter threshold level for the inverter gate.

DETAILED DESCRIPTION OF THE INVENTION

Figure 3:
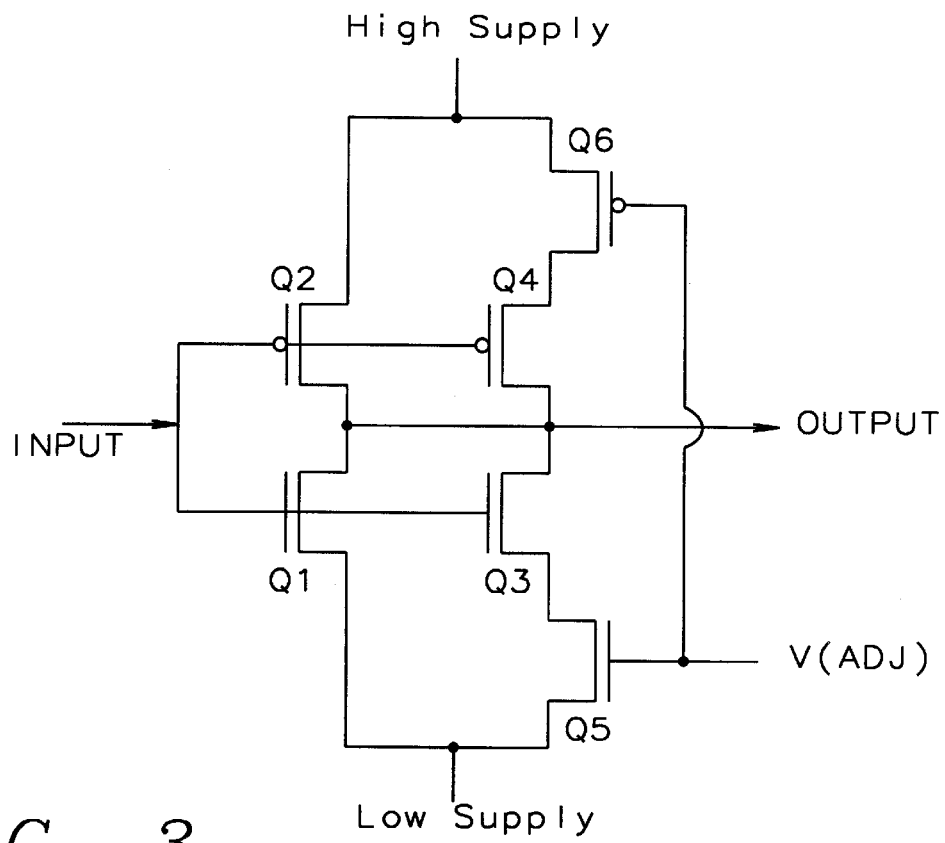
FIG. 3 is a schematic diagram of a CMOS inverter input buffer circuit with an adjustable trip point of this invention.

Refer now to FIG. 3 to discuss the operation of the input buffer circuit. The input terminal is connected to the gates of the NMOS transistors $Q_1$ and $Q_3$ and the PMOS transistors $Q_2$ and $Q_4$. The input terminal will be connected through an input/output pad to external circuitry that will provide an input signal that will have electrical characteristic voltage levels that will comply to the characteristic voltage levels of technologies such as TTL, LVTTL, SSTL, and GTL.

The source of the PMOS transistor $Q_2$ is connected to the high supply voltage source. The drains of the PMOS transistors $Q_2$ and $Q_4$ are connected together and to the drains of the NMOS transistors $Q_1$ and $Q_3$ and to the output terminal. The output terminal is connected to the internal circuitry of the integrated circuit. The source of the NMOS transistor $Q_1$ is connected to the low supply voltage source.

The source of the PMOS transistor $Q_4$ is connected to the drain of the PMOS transistor $Q_6$ and the source of the PMOS transistor $Q_6$ is connected to the high supply voltage source. The source of the NMOS transistor $Q_3$ is connected to the drain of the NMOS transistor $Q_5$. The source of the NMOS transistor $Q_5$ is connected to the low supply voltage source.

The gate of NMOS transistor $Q_5$ and the gate of PMOS transistor $Q_6$ are connected together and to an adjustment voltage circuit Vadj.

The adjustment voltage circuit Vadj will provide a voltage that is near the mid-range between the voltage levels of the high supply voltage source and the low supply voltage source. In this situation, the PMOS transistor $Q_6$ and the NMOS transistor $Q_5$ are conducting to a degree determined by the voltage level of the adjustment voltage circuit Vadj. This base case provides the most general adjustability of the buffer trip point, since the voltage level of the adjustment voltage circuit Vadj has an operational range about the mid-range between the voltage levels of the high supply voltage source and the low supply voltage source in which it controls the conduction of both the PMOS transistor $Q_6$ and the NMOS transistor $Q_5$ simultaneously.

The geometries of the PMOS transistor $Q_6$ and the NMOS transistor $Q_5$ are sufficiently larger than the PMOS transistor $Q_4$ and the NMOS transistor $Q_3$ that the PMOS transistor $Q_6$ and the NMOS transistor $Q_5$ remain in the linear or "resistive" region throughout the operation of the input buffer circuit.

The equation that governs the operation of the PMOS transistor $Q_6$ and the NMOS transistor $Q_5$ is of the standard form:

$$I_{DS} = k*\left\{(V_{GS}-V_T)*V_{DS} - \left(\frac{1}{2}\right)*V_{DS}^2\right\}$$

where
- $I_{DS}$ is the drain to source current through the transistor.
- k is a constant related to the mobility, gate capacitance, and the size of the transistor.
- $V_{GS}$ is the voltage developed from the gate to the source of the transistor.
- $V_T$ is the voltage developed from the gate to the source of the transistor at which the transistor will begin to conduct.
- $V_{DS}$ is the voltage developed from the drain to the source of the transistor.

For very small values of the drain to source voltage $V_{DS}$ the equation is linear, thus the effective resistance of each transistor is:

$$R \cong \left(\frac{\delta I_{DS}}{\delta V_{DS}}\right)$$

where:
- R is the resistance transistor.

At the trip point for the input buffer circuit, the PMOS transistors $Q_2$ and $Q_4$ and the NMOS transistors $Q_1$ and $Q_3$ will be in the saturation region, since the gates and drains will be at the same potential. For sub-micron Field Effect Transistor processing, the velocity saturation dominates the saturation characteristics of the transistor, thus the drain to source current $I_{DS}$ will be a linear function of the gate to source voltage $V_{GS}$ or the form:

$$I_{DS} = K*(V_{GS}-V_T)$$

where
- K is the saturation gain constant.

The NMOS transistor $Q_3$ will have the NMOS transistor $Q_5$ in series with its source. Since the NMOS transistor $Q_5$ is essentially a resistor (denoted as $R_5$), the NMOS transistor $Q_5$ reduces the gate to source voltage $V_{GS}$ of the NMOS transistor $Q_3$ by an amount proportional to the drain current. The function for the drain to source current of the NMOS transistor $Q_3$ is:

$$I_{Q3DS} = K_{Q3}*(V_{Q3GS} - R_5 I_{Q3DS} - V_{Q3T})$$

$$I_{Q3DS} = \left\{\frac{K_{Q3}}{1-R_5 K_{Q3}}\right\}(V_{Q3GS} - V_{Q3T})$$

The result of the resistance $R_5$ of the NMOS transistor $Q_5$ is to reduce the effective gain factor of the NMOS transistor $Q_3$ as follows:

$$K_{Q3} \Rightarrow \left\{\frac{K_{Q3}}{(1+R_5*K_{Q3})}\right\}$$

The operation of the NMOS transistor $Q_3$ is according to the standard saturation current equation.

The range of control of the gain factor $K_{Q3}$ by the resistance $R_5$ of the NMOS transistor $Q_5$ depends on the values of the resistance $R_5$ of the NMOS transistor $Q_5$. When the NMOS transistor $Q_5$ is nearly in the non-conducting state so that the resistance $R_5$ of the NMOS transistor $Q_5$ is very large, the effective gain constant of the NMOS transistor $Q_3$ is:

$$K_{Q3} \cong \left\{\frac{1}{R_5}\right\}$$

and can be made nearly zero. The maximum effective gain $K_{Q3}$ for the NMOS transistor $Q_3$ occurs if the value of the resistance $R_5$ of the NMOS transistor $Q_5$ is nearly zero compared with the value of the effective gain $K_{Q3}$ for the NMOS transistor $Q_3$. In this case the gain constant equals that of $K_{Q3}$ for the NMOS transistor $Q_3$ itself. In order for the value of the resistance $R_5$ of the NMOS transistor $Q_5$ to be negligible relative to the gain constant equals that of $K_{Q3}$ for the NMOS transistor $Q_3$, the NMOS transistor $Q_5$ has to have a relatively large width to length ratio as compared to the NMOS transistor $Q_3$. The width to length ratio should not be so large as to be effectively infinite. The practical range of gains of the of $K_{Q3}$ for the NMOS transistor $Q_3$ and the NMOS transistor $Q_5$ together might be from 0 for the NMOS transistor $Q_5$ not conducting to $0.66*K_{Q3}$ for the NMOS transistor $Q_5$ in full conduction.

Thus the total effect of the resistance $R_5$ of the NMOS transistor $Q_5$ is to vary the gain constant $K_{Q3}$ of the NMOS transistor $Q_3$. Since the NMOS transistor $Q_1$ and the resistance $R_5$ of the NMOS transistor $Q_5$ are connected in parallel in the buffer circuit, their gains add:

$$K_{\{Q1\|Q3R5\}} = K_{Q1} + \left\{\frac{K_{Q3}}{1+R_5*K_{Q3}}\right\}$$

The PMOS transistor Q4 will have the PMOS transistor $Q_6$ in series with its source. Since the PMOS transistor $Q_6$ is essentially a resistor (denoted as $R_6$), the PMOS transistor $Q_6$ reduces the gate to source voltage $V_{GS}$ of the PMOS transistor $Q_4$ by an amount proportional to the drain current. The analysis of the gain $K_{Q6}$ of the PMOS transistors $Q_4$ and $Q_6$ is equivalent to that of the NMOS transistors $Q_3$ and $Q_5$ as described above. Thus the total effect of the resistance $R_6$ of the NMOS transistor $Q_6$ is to vary the gain constant $K_{Q4}$ of the PMOS transistor $Q_4$. Since the PMOS transistor $Q_2$ and the resistance $R_6$ of the PMOS transistor $Q_6$ are connected in parallel in the buffer circuit, their gains add:

$$K_{\{Q2\|Q4R6\}} = K_{Q2} + \left\{\frac{K_{Q4}}{1+R6*K_{Q4}}\right\}$$

Now to explore the calculation of the trip point, for a simple CMOS inverter in which the threshold voltages $V_T$ for the NMOS and PMOS transistors are small relative to the high supply voltage source ($V_{cc}$), it can be shown that the trip point is calculated using the NMOS and PMOS transistor gain constants shown above as follows:

$$\frac{V_{(trip)}}{V_{CC}} = \frac{K_N}{(K_N+K_P)}$$

where:
- $V_{(trip)}$ is the trip point voltage for the CMOS inverter.
- $K_N$ is the gain constant for the NMOS transistors of the CMOS inverter.
- $K_p$ is the gain constant for the PMOS transistors of the CMOS inverter.

The same equation will apply for the input buffer circuit of this invention except now the effective gain constants now replace the gain constant above. The calculation now becomes:

$$\frac{V_{(trip)}}{V_{CC}} = \frac{K_{\{Q1\|Q3R5\}}}{(K_{\{Q1\|Q3R5\}} + K_{\{Q2\|Q4R6\}})}$$

As an example of the above design, if the NMOS transistor $Q_1$ and the PMOS transistor $Q_2$ are designed to have gain constants $K_{Q1}$ and $K_{Q2}$ equal to K and the NMOS transistor $Q_3$ and the PMOS transistor $Q_4$ are designed to have gain constants $K_{Q3}$ and $K_{Q4}$ equal to 2K. The resistances $R_5$ and $R_6$ of the NMOS transistor $Q_5$ and the PMOS transistor $Q_6$ are designed to be negligible with respect to the value 2K. If these values are substituted in the above function, the adjustment ranges of the NMOS and PMOS transistors are equal and are given by:

$$K < K_{\{Q1\|Q3R5\}} < 3*K$$

$$K < K_{\{Q2\|Q4R6\}} < 3*K$$

So the adjustment range of $V_{(trip)}/V_{cc}$ can be shown to be:

$$\frac{1}{4} < \frac{V_{(trip)}}{V_{CC}} < 3/4$$

This would provide a wider adjustability band than is usually required for most interface circuits. Actually with non-zero thresholds and practical device sizes, the bands will naturally be narrower. This adjustability band would be no greater than 25% of the high supply voltage source $V_{cc}$. Typically a good design strategy would be to make the inverter formed by the NMOS transistor $Q_1$ and the PMOS transistor $Q_2$ have a trip point as close as is practical to the design value of the interface specification and use the adjustment values from the NMOS transistors $Q_3$ and $Q_5$ and the PMOS transistors $Q_4$ and $Q_6$ to make small adjustments. This would minimize the sensitivity of the circuit to the voltage level of the adjustment voltage source Vadj and maximize the noise margin of the adjustment voltage source Vadj.

Figure 4:
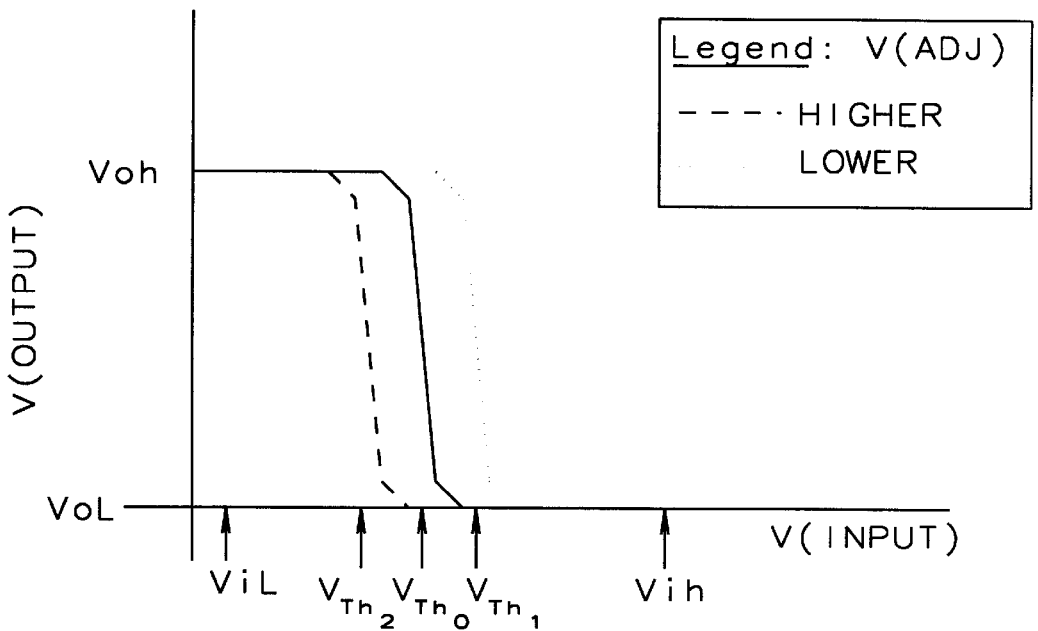
FIG. 4 is plot of the transfer characteristic for the input voltage versus the output voltage of the CMOS inverter input buffer of this invention.

Referring now to FIG. 4 to understand how the adjustment voltage effects the transfer characteristics of the voltage level of the input signal versus the voltage level of the output signal. FIG. 4 is a plot of the voltage level of the output signal on the vertical axis versus the voltage level of the input signal on the horizontal axis. When the voltage level of the input signals is at a low voltage level (that of the first logic state (0)) $V_{il}$, the voltage level of the output is at a high voltage level (that of the second logic state (1)) $V_{oh}$. As the voltage level of the input signal is raised to the level of the threshold trip point $V_{th0}$, the voltage level of the output signal will change rapidly to the low voltage level (that of the first logic level (0)) $V_{ol}$. The voltage level of the input signal will continue to rise to high voltage level (that of the second logic state (1)) $V_{ih}$. The difference in the threshold voltage level of $V_{th0}$ and the voltage level $V_{ih}$ and the voltage level $V_{il}$ and the threshold voltage level $V_{th0}$ determines the noise margin of the input buffer circuit.

Because of variations in semiconductor processing parameters, power supply voltage, or temperature, the threshold trip point $V_{th0}$ may not be exactly at the threshold trip point required by the electrical characteristics of the technologies such as TTL, LVTTL, SSTL, and GTL. To compensate for the shift in the threshold trip point $V_{th0}$, the adjustment voltage can be modified lower to shift the threshold trip point to the voltage level $V_{th1}$ or the adjustment voltage can be modified higher to shift the threshold trip point to the voltage level $V_{th2}$.

Figure 5:
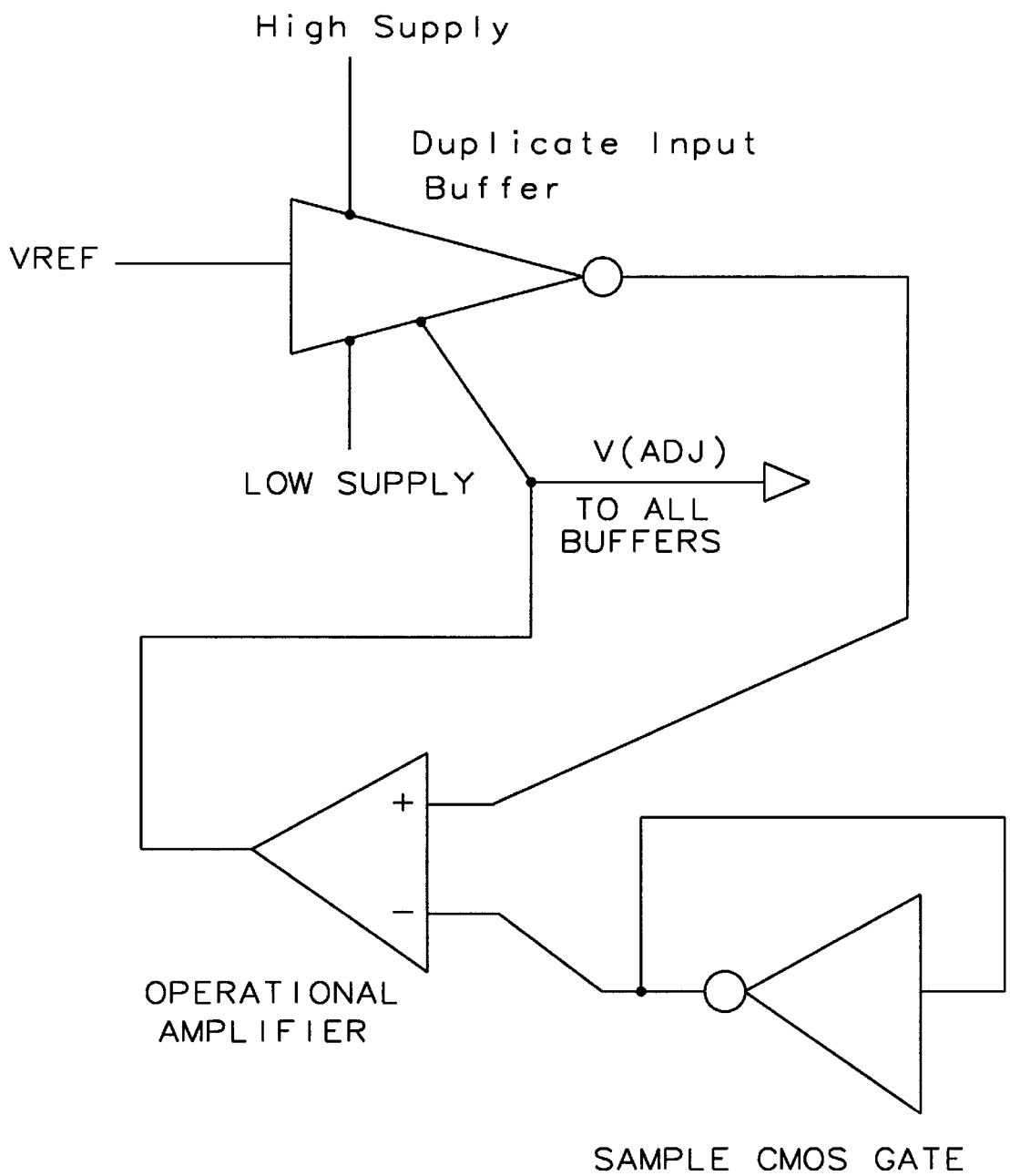
FIG. 5 is a schematic diagram of a first embodiment of the voltage adjustment circuit of this invention.

FIG. 5 shows the voltage adjustment circuit that will provide the adjustment voltage Vadj for a plurality of input buffer circuits as shown in FIG. 3. A duplicate copy of the input buffer circuit of FIG. 3 that has been scaled to minimize the DC power of the circuit, has its input connected to a reference voltage source Vref. The reference voltage source Vref may be internal or external to the integrated circuits containing the input buffer of FIG. 3. The reference voltage source is equal to the desired trip point of the input buffer circuit of FIG. 3 and will be designed to be independent of variations in semiconductor processing parameters, power supply voltage, and temperature.

The output of the duplicate copy of the input buffer circuit is connected to the noninverting input (+) of the operational amplifier. The inverting input (−) of the operational amplifier is connected to a sample CMOS gate that is suitably sized to minimize DC power and that has its input connected to its output. The sample CMOS gate is a duplicate copy of the internal circuitry of the integrated circuits containing the input buffer circuit of FIG. 3. By connecting the input of the sample CMOS circuit to the output of the sample CMOS inverter, the voltage at the inverting input of the operational amplifier is set to the threshold voltage of the internal circuitry.

The output of the operational amplifier becomes the adjustment voltage Vadj connected to the plurality of the input buffer circuits of FIG. 3. The output of the operational amplifier is also connected to the adjustment voltage Vadj of the duplicate copy of the input buffer.

The output of the duplicate copy of the input buffer circuit of FIG. 3 will be set to the threshold of the internal gates. The feedback to the operational amplifier from the duplicate copy of the input buffer circuit of FIG. 3 will cause the adjustment voltage to always be set such that the output voltage of the duplicate copy of the input buffer circuit of FIG. 3 will be at the threshold voltage of the internal gates.

Figure 6:
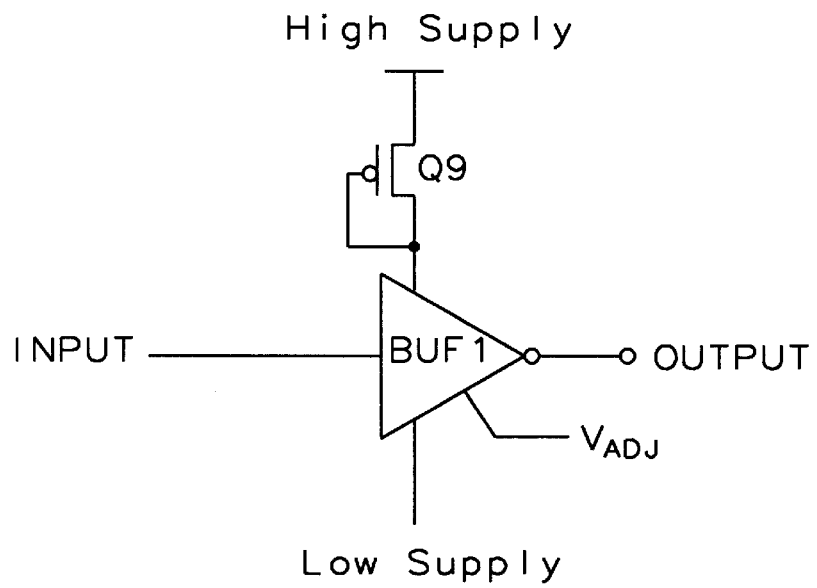
FIG. 6 is a schematic diagram of a first high supply adjustment circuit for the CMOS inverter input buffer circuit of this invention.
Figure 7:
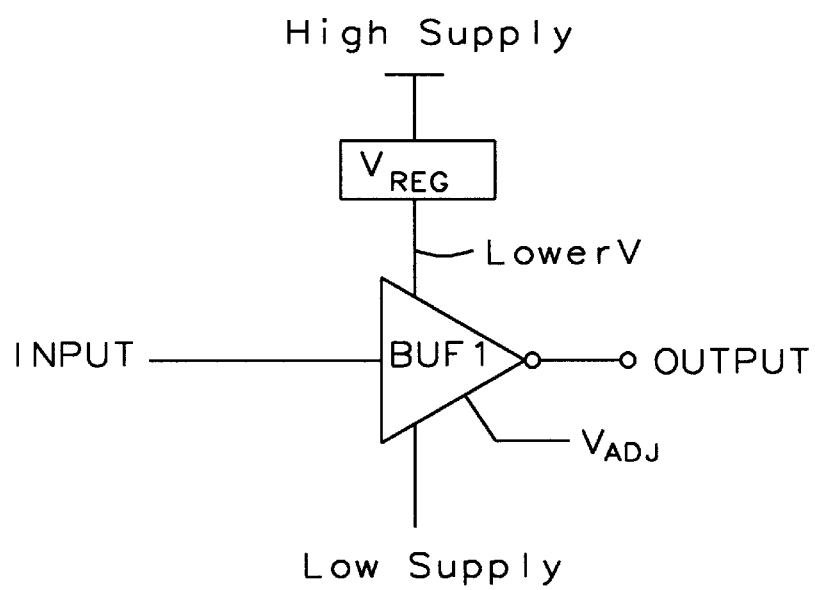
FIG. 7 is a schematic diagram of a second high supply adjustment circuit for the CMOS inverter input buffer circuit of this invention.

Referring now to FIG. 6 and FIG. 7 for high supply adjustment circuits for the CMOS inverter input buffer circuit of this invention. The inverter input buffer circuit Buf1 of this invention may have a power supply voltage source that is greater than necessary to be able to be interface to the external circuitry. If the power supply voltage source is sufficiently large, the input buffer circuit Buf1 will dissipate excessive power. To resolve this in FIG. 6 a PMOS transistor $Q_9$ is placed between the power supply voltage source (high supply) and the high supply terminal of the input buffer circuit Buf1. The PMOS transistor $Q_9$ will be connected as a diode such that the voltage at the high supply terminal of the input buffer circuit Buf1 being the value of the power supply voltage source less the threshold voltage $V_T$ of the PMOS transistor $Q_9$.

If the voltage level at the high supply terminal of the input buffer circuit is to be more that a threshold voltage $V_T$ of the PMOS transistor $Q_9$, a voltage regulator Vreg as shown in FIG. 7 will be placed between the high supply terminal of the input buffer circuit BUF1 and the power supply voltage source (high supply). The voltage regulator will generate the lower voltage LowerV to supply the high supply terminal of the input buffer circuit BUF1.

Figure 8:
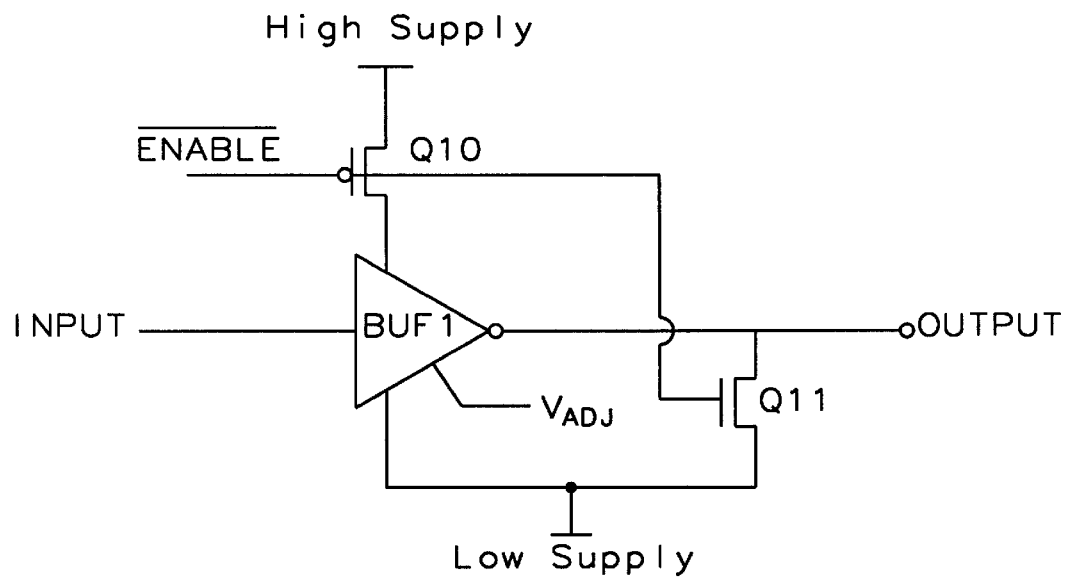
FIG. 8 is a schematic diagram of an enable circuit for the CMOS inverter input buffer circuit of this invention.

Refer now to FIG. 8 to examine an enable circuit to control the activity of the input buffer circuit BUF1 of this invention. The PMOS transistor $Q_{10}$ is placed between the high supply and the high supply terminal of the input buffer circuit BUF1. An enable signal at the ENABLE terminal is connected to the gate of the PMOS transistor $Q_{10}$.

The NMOS transistor $Q_{11}$ has its drain connected to the output terminal of the input buffer circuit BUF1, its source connected to the low supply, and its gate connected to the ENABLE terminal.

If the enable signal is at the first logic state (0) it will cause the PMOS transistor $Q_{10}$ to conduct thus activating the input buffer BUF1 and turning the NMOS transistor $Q_{11}$ to a non-conducting state. However, if the enable signal is at the second logic state (1), it will cause the PMOS transistor $Q_{10}$ to cease conduction thus deactivating the CMOS inverter and the NMOS transistor $Q_{11}$ will conduct thus effectively connecting the output terminal to the low supply.

Figure 9:
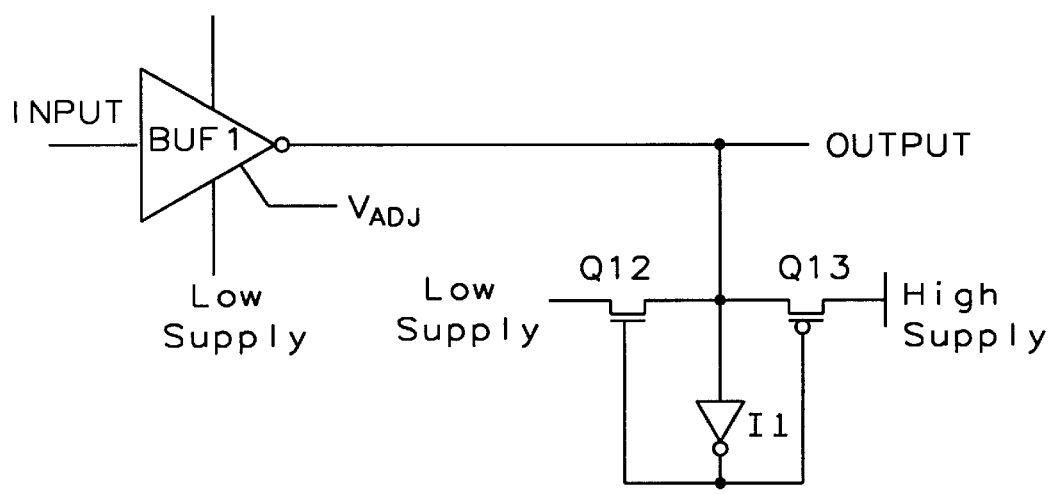
FIG. 9 is a schematic diagram of a CMOS inverter input buffer circuit incorporating hysteresis of this invention.

A first type of hysteresis adjustment is shown in FIG. 9. The output terminal of the input buffer circuit BUF1 is connected to the drains of the NMOS transistor $Q_{12}$ and the PMOS transistor $Q_{13}$ and to the input of the internal inverter gate $I_1$. The source of the NMOS transistor $Q_{12}$ is connected to the low supply and the source of the PMOS transistor $Q_{13}$ is connected to the high supply. The output of the internal inverter $I_1$, is connected to the gates of the NMOS transistor $Q_{12}$ and the PMOS transistor $Q_{13}$.

If the output terminal is at the first logic state (0), the output to the internal inverter $I_1$ is at the second logic state (1) thus causing the NMOS transistor $Q_{12}$ to be conducting placing the output terminal effectively at the low supply. As the input of the input buffer circuit BUF1 starts to change from the second logic state (1) to the first logic state (0) the input buffer circuit BUF1 will start to raise the voltage present at the output terminal. This will cause the internal inverter to begin to change state thus beginning to stop the NMOS transistor $Q_{12}$ from conducting and the PMOS transistor $Q_{13}$ to begin to conduct. This will cause the a positive feedback that will snap the internal inverter to the first logic state (0) and the output will have changed rapidly to the second logic state (1). The change will happen at a voltage level that is different from that determined by the adjustment voltage Vadj.

If the input of the input buffer circuit BUF1 is at the first logic state (0) and is changing to the second logic state (1), the action of the hysteresis is the same as above described but in the opposite direction. The level that the output will switch will be determined by geometeries of the NMOS transistor $Q_{12}$ and the PMOS transistor $Q_{13}$.

Figure 1:
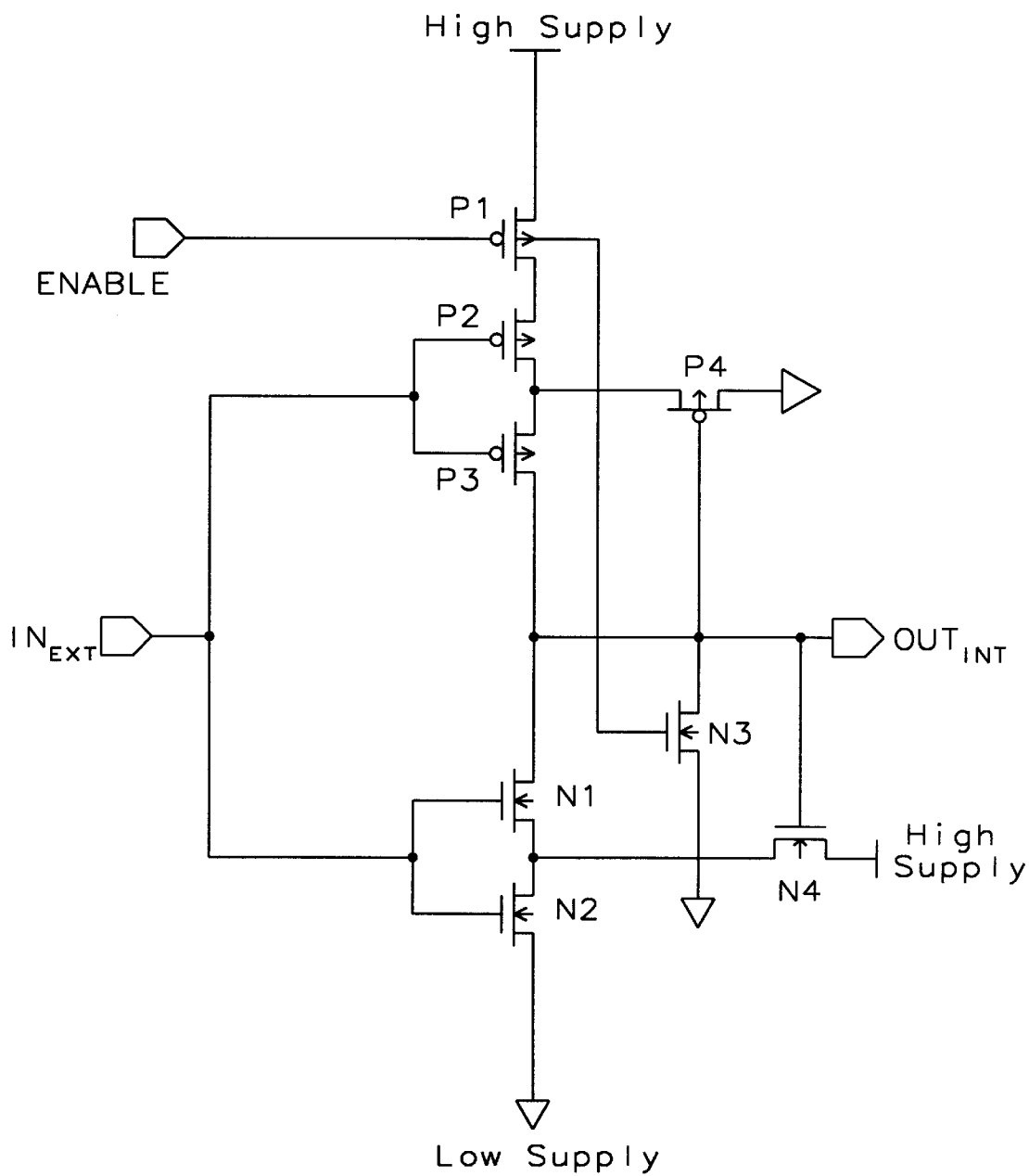
FIG. 1 is a schematic diagram of a CMOS inverter input buffer of the prior art.
Figure 2:
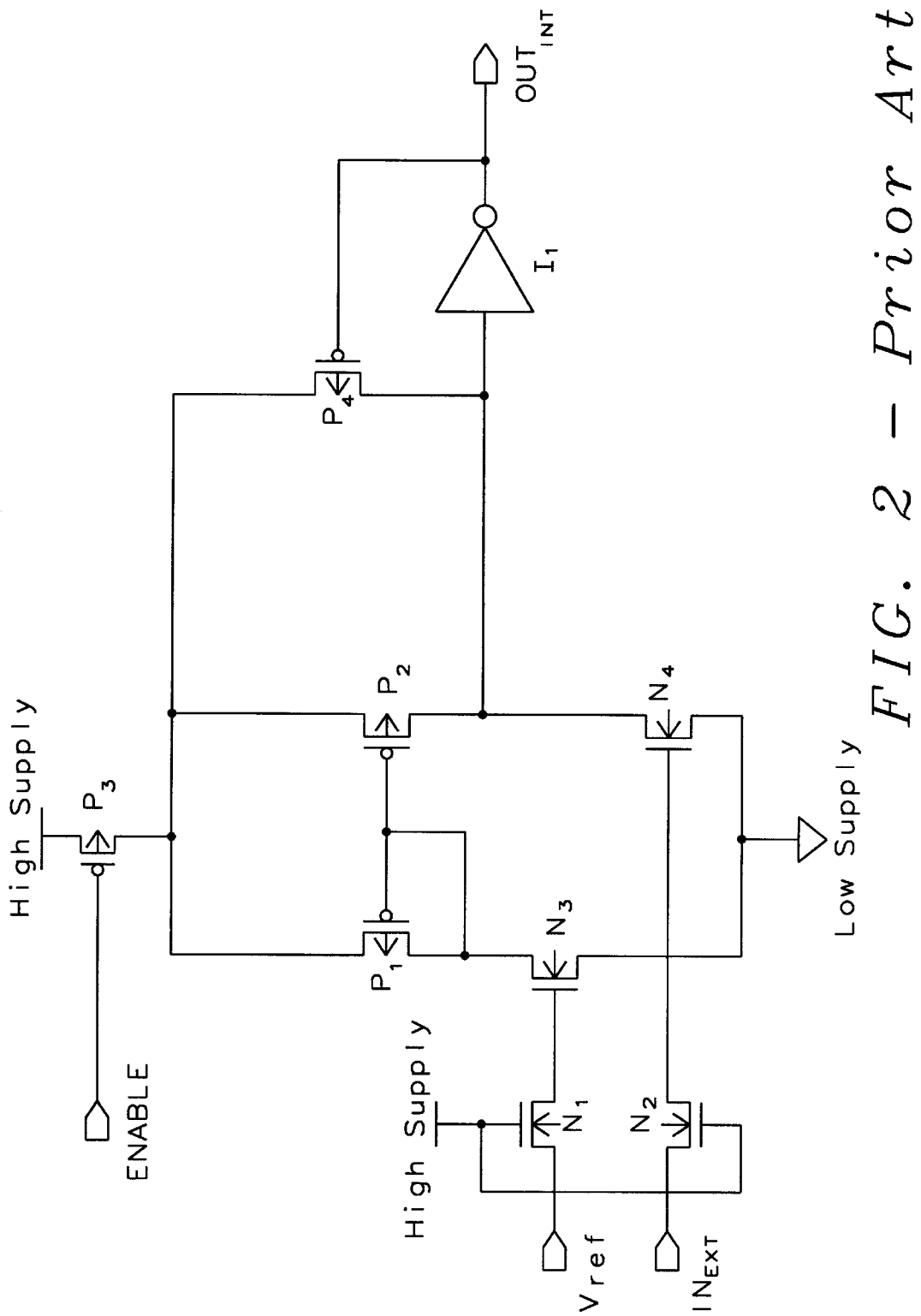
FIG. 2 is a schematic diagram of a differential CMOS input buffer of the prior art.
Figure 10:
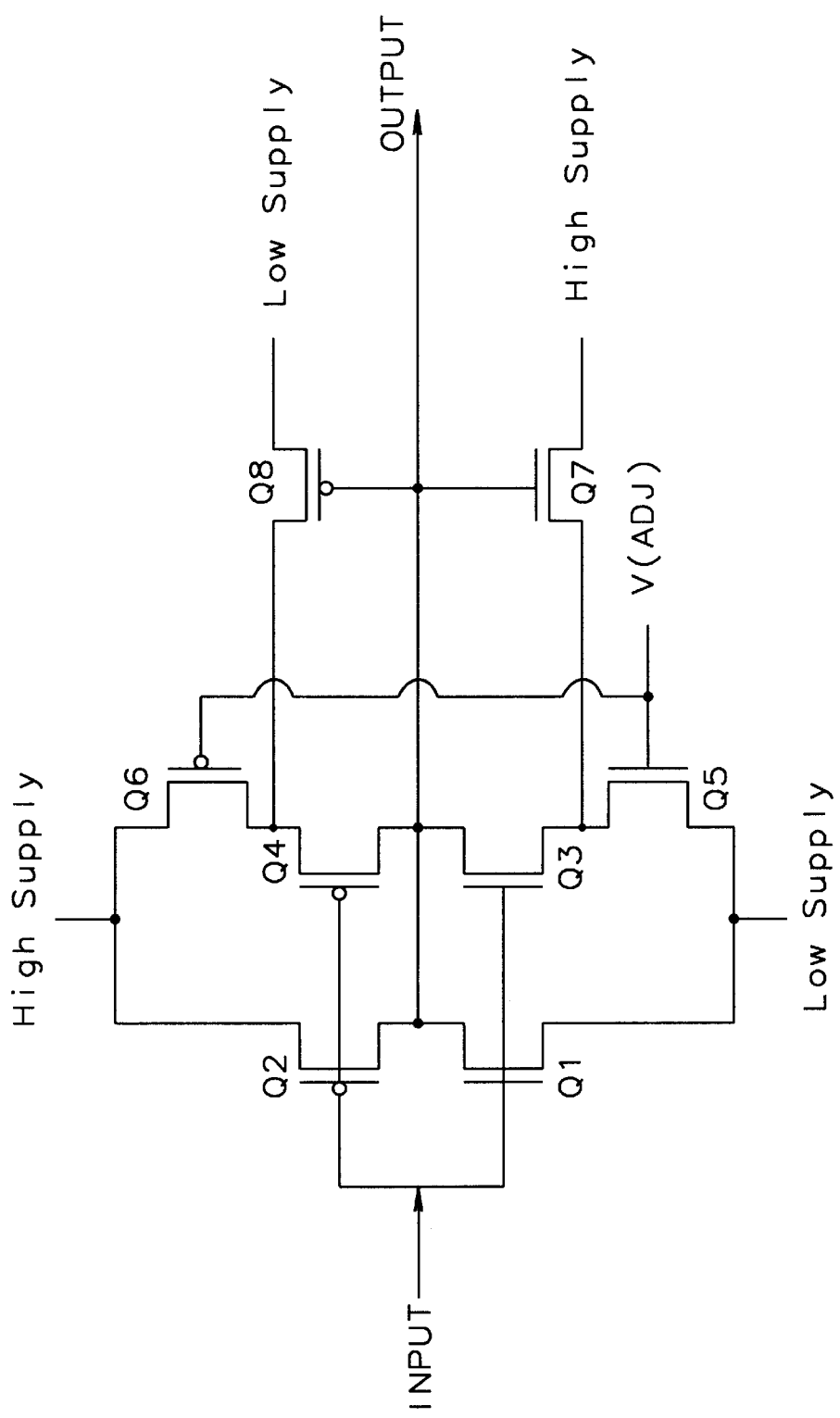
FIG. 10 is a schematic diagram of a CMOS inverter input buffer circuit incorporating hysteresis of this invention.

For another configuration of the input buffer circuit incorporating hysteresis, refer now to FIG. 10. The NMOS transistors $Q_1$, $Q_3$, and $Q_5$, and the PMOS transistors $Q_2$, $Q_4$, and $Q_6$ are structured as the input buffer circuit of FIG. 3. The NMOS transistor $Q_7$ is connected between the common node of the NMOS transistors $Q_3$ and $Q_5$ and the high supply voltage source. When the input signal at the input terminal is at the first logic state (0) and the output is at the second logic state (1), the NMOS transistor $Q_7$ is in hard conduction thus essentially placing the high supply voltage source at the common node between the NMOS transistors $Q_3$ and $Q_5$. As the input signal at the input terminal begins to change from the first logic state (0) to the second logic state (1), the NMOS transistor $Q_1$ begins to conduct thus lowering the voltage at the output. The NMOS transistor $Q_3$ will remain cutoff since its source is essentially at the high supply voltage level. This will modify the trip point of the inverter established by the adjustment voltage Vadj in a fashion similar to that described in FIG. 1.

The PMOS transistor $Q_8$ is connected between the common node of the PMOS transistors $Q_4$ and $Q_6$ and the high supply voltage source. When the input signal at the input terminal is at the second logic state (1) and the output is at the first logic state (0), the PMOS transistor $Q_8$ is in hard conduction thus essentially placing the low supply voltage source at the common node between the PMOS transistors $Q_4$ and $Q_6$. As the input signal at the input terminal begins to change from the second logic state (1) to the first logic state (0), the PMOS transistor $Q_2$ begins to conduct thus raising the voltage at the output. The PMOS transistor $Q_4$ will remain cutoff since its source is essentially at the low supply voltage level. This will modify the trip point of the inverter established by the adjustment voltage Vadj in a similar fashion as described in FIG. 1

The hysteresis will be controlled by the ratio of the geometries of the NMOS transistors $Q_3$ and $Q_7$ and the ratio of the geometries of the PMOS transistors $Q_4$ and $Q_8$.

While this invention has been particularly shown and described with reference to the preferred embodiments thereof, it will be understood by those skilled in the art that various changes in form and details may be made without departing from the spirit and scope of the invention.

What is claimed is:

1. An input buffer interface within an integrated circuit coupled between a high supply voltage source and a low supply voltage source to accept one or more input signals, buffer said input signals, and to convert said input signals to output signals acceptable to internal circuitry within said integrated circuit, comprising:

a) at least one input buffer circuit, whereby each input buffer circuit is comprising:

an input terminal coupled to an input/output pad that is connected to external circuitry that will generate said input signal, a buffer output terminal coupled to said internal circuitry to transfer the output signal to said internal circuitry, a voltage adjustment terminal to receive a voltage adjustment signal indicating a buffer threshold trip point level that is an input voltage level of said input signal at which said output signal will change between a first output logic level and a second output logic level, an input amplifier connected between the input terminal and the output terminal to receive one of the input signals convert said input signal to the output signal, and a threshold trip point modification circuit connected between the output terminal and the voltage threshold adjustment terminal to modify the threshold trip point level as a function of the voltage adjustment signal; and b) a voltage adjustment means connected to said volatile adjustment terminal, comprising:

an internal inverter constructed of a basic circuit connected such that the output of the basic inverter circuit is connected to the input of said basic inverter circuit to provide a threshold voltage level of said internal circuits, and a voltage adjuster connected to receive a stable reference voltage, connected to said internal inverter circuit to receive said threshold voltage level, and connected to the voltage adjustment terminal to provide said voltage adjustment as a function of the stable voltage reference and the threshold voltage of the internal circuits.

2. The input buffer interface of claim 1 wherein the input signal is voltage signal selected from a group of voltage signals consisting of TTL signals, LVTTL signals, SSTL signals, and GTL signals.

3. The input buffer interface of claim 1 further comprising a power saving means to reduce a voltage level of said high supply voltage source so as to minimize power dissipation of said input buffer circuit and coupled between said high supply voltage source and said high supply terminal.

4. The input buffer interface of claim 3 wherein said power saving means comprises a diode connected MOS transistor of the second conductivity type to reduce the voltage level of the high supply voltage source by a voltage equivalent to a threshold voltage of a MOS transistor of the second conductivity type.

5. The input buffer interface of claim 3 wherein said power saving means is a voltage regulator that will reduce the voltage level of the high supply voltage source to a desired lower voltage.

6. The input buffer interface of claim 1 further comprising an enabling means coupled between the high supply voltage source and the high supply terminal and between the buffer output terminal and the low supply terminal to enable and disable said input buffer circuit according to a logic level present at a enable control terminal.

7. The input buffer interface of claim 1 further comprising a hysteresis means coupled between the buffer output terminal, high supply terminal, and the low supply terminal to modify the buffer threshold trip point such that said buffer threshold trip point will differ for said input voltage level changing from the first logic level to the second logic level from said input voltage level changing from the second logic level to the first logic level.

8. The input buffer interface of claim 7 wherein said hysteresis means comprises:
   a) a fourth MOS transistor of the first conductivity type having a source coupled to the low supply terminal, a drain coupled to buffer output terminal, and a gate;
   b) a fourth MOS transistor of the second conductivity type having a source coupled to the high supply terminal, a drain coupled to buffer output terminal, and a gate; and
   c) a hysteresis control gate having an input terminal coupled to the buffer output terminal, an output terminal coupled to the gates of the fourth MOS transistors of the first and second conductivity types, and an inversion means to invert the output signal at said buffer output terminal, wherein if the output signal is at the first logic level the fourth MOS transistor of the first conductivity type is conducting and if the output signal is at a second logic level, the fourth MOS transistor of the second conductivity type is conducting, and as the input signal begins to change between the first logic level and the second logic level the fourth MOS transistors of the first and second conductivity types will modify said buffer threshold trip point.

9. The input buffer interface of claim 1 wherein each of the input buffer circuits comprises:
   a) a first MOS transistor of a first conductivity type having a gate connected to the input terminal, a drain connected to the buffer output terminal, and a source connected to the low supply terminal; and
   b) a first MOS transistor of a second conductivity type having a gate connected the input terminal, a drain connected to the buffer output terminal, a source connected to the high supply terminal.

10. The input buffer interface of claim 1 wherein the threshold trip point modification circuit comprises:
    a) a second MOS transistor of the first conductivity type having a gate connected to the input terminal, a drain connected to the buffer output terminal, and a source;
    b) a second MOS transistor of the second conductivity type having a gate connected to the input terminal, a drain connected to the buffer output terminal, and a source;
    c) a third MOS transistor of the first conductivity type having a gate connected to the voltage adjustment terminal, a drain connected to the source of the second MOS transistor of the first conductivity type and a source connected to the low supply terminal; and
    d) a third MOS transistor of the second conductivity type having a gate connected to the voltage adjustment terminal, a drain connected to the source of the second MOS transistor of the second conductivity type, and a source connected to the high terminal.

11. The input buffer interface of claim 10 further comprising a hysteresis means coupled between the buffer output terminal, high supply terminal, and the low supply terminal to modify the buffer threshold trip point such that said buffer threshold trip point will differ for said input voltage level changing from the first logic level to the second logic level from said input voltage level changing from the second logic level to the first logic level.

12. The input buffer interface of claim 11 wherein said hysteresis means comprises:
    a fifth MOS transistor of the second conductivity type having a source coupled to the drain of the third MOS transistor of the second conductivity type, a drain coupled to the low supply terminal, and a gate coupled to the buffer output terminal, whereby if the output signal is at the first logic level, said fifth MOS transistor of the second conductivity type will be conducting effectively coupling the source of the third MOS transistor of the second conductivity type to the low supply terminal, and if the output signal is at the second logic level the fifth MOS transistor of the second conductivity type will not be conducting thus causing a differing in said buffer threshold point.

* * * * *